United States Patent
Lee et al.

(10) Patent No.: US 7,352,807 B2
(45) Date of Patent: Apr. 1, 2008

(54) APPARATUS AND METHOD FOR GENERATING PULSE BASED ON TIME DELAY AND WAVE TRANSFORM AND TRANSMITTER OF MULTI-FREQUENCY BAND COMMUNICATION SYSTEM USING THE SAME

(75) Inventors: Seung-Sik Lee, Daejon (KR); Jae-Young Kim, Seoul (KR); Hyung-Soo Lee, Daejon (KR); Chang-Joo Kim, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 702 days.

(21) Appl. No.: 10/850,614

(22) Filed: May 21, 2004

(65) Prior Publication Data

US 2004/0233982 A1    Nov. 25, 2004

(30) Foreign Application Priority Data

May 22, 2003   (KR) ............................... 2003-32607

(51) Int. Cl.
*H03K 7/08* (2006.01)
(52) U.S. Cl. ..................................... 375/238
(58) Field of Classification Search ................ 375/238, 375/259, 295, 285, 340; 370/212; 327/31, 327/172
See application file for complete search history.

(56) References Cited

U.S. PATENT DOCUMENTS

| | | | |
|---|---|---|---|
| 4,743,906 A | 5/1988 | Fullerton | |
| 4,979,186 A | 12/1990 | Fullerton | |
| 5,216,695 A | 6/1993 | Ross et al. | |
| 5,586,145 A | 12/1996 | Morgan et al. | |
| 5,914,622 A * | 6/1999 | Inoue ......................... | 327/172 |
| 6,690,741 B1 * | 2/2004 | Larrick et al. .............. | 375/295 |
| 2002/0176511 A1 * | 11/2002 | Fullerton et al. ........... | 375/285 |

FOREIGN PATENT DOCUMENTS

| | | |
|---|---|---|
| KR | 2000-12883 | 3/2000 |
| KR | 2001-34884 | 4/2001 |
| KR | 2001-0088277 | 9/2001 |

OTHER PUBLICATIONS

J.S. Lee and C. Nguyen "Uniplanar Picosecond Pulse Generator Using Step-Recovery Diode" Electronics Letters, vol. 37, No. 8, Apr. 12, 2001, pp. 504-506.

* cited by examiner

*Primary Examiner*—David C. Payne
*Assistant Examiner*—Leon Flores
(74) *Attorney, Agent, or Firm*—Blakely, Sokoloff, Taylor & Zafman LLP (57) ABSTRACT

Disclosed is an apparatus and method for generating pulse based on time delay and wave transform and transmitter of multi-frequency band communication system using the same. The apparatus includes: an apparatus for generating a pulse based on time delay and wave transform, including: a time delay control unit having a plurality of time delay controller, each for providing time delay information; an amplitude control unit for providing amplitude information; a time delay unit having a plurality of time delayers, each for departing a square wave from a trigger signal, delaying time of the square wave based on the time delay information, and adjusting an amplitude of the square wave based on the amplitude information, to thereby generate a time-delayed signal; a pulse shaping unit for shaping a pulse based on the time-delayed signals; and a wave transforming unit for transforming the pulse to a desired signal.

13 Claims, 8 Drawing Sheets

APPARATUS AND METHOD FOR GENERATING PULSE BASED ON TIME DELAY AND WAVE TRANSFORM AND TRANSMITTER OF MULTI-FREQUENCY BAND COMMUNICATION SYSTEM USING THE SAME

FIELD OF THE INVENTION

The present invention relates to an apparatus and method for generating a pulse based on time delay and wave transform and a transmitter of a multi-frequency band communication system using the same; and, more particularly, to a pulse generator capable of adjusting an amplitude and a width of a pulse based on time delay and wave transform, and a transmitter of a multi-frequency band communication system wherein a multi-frequency band communication and multi-user system are implemented by adjusting the width of a pulse without using a carrier frequency.

DESCRIPTION OF RELATED ART

In general, a number of issues most developers have to confront in the development of a communication device include low power consumption, reuse of a frequency, channelization and economic viability.

What came out as an alternative to existing technologies is an ultra-wide band (UWB) communication. The UWB technology consumes lower power than what is usually expected of a device using wide frequency band ranged from few GHz to tens GHz. The transmission speed can be as little as 50 Mbps and reach up to 1 Gbps. As an advantage of the UWB technology, the compatibility thereof, in cooperation with security measures put in place therein enables the wide use of the UWB technology.

In most of wireless technologies other than the UWB, e.g., cellular, satellite, Television communication systems, information is conveyed by transforming the basic waveform of a reference frequency known as a radio frequency (RF) carrier. On the contrary, the UWB is a communication technology for transmitting a pulse via an antenna at regular time intervals wherein each time interval is on the order of less than 1 nanosecond. In which case, the pulse is referred to as an electric signal that has a fixed shape and period. In other words, the UWB is a wireless technology for transmitting a pulse of extremely short duration at regular time intervals. As in Morse code, the conveyance of information is effected by modulating the front and back parts of the pulse in such a way that the modulated pulse carrying the sign of '−' represents '0' whereas the modulated pulse carrying the sign of '+' represents '1'.

The punctual transmission of such encoded pulses makes possible the sending of a huge amount of data and ideally the handling of an endless number of user's requests.

The overall performance of a transmitter is largely determined by how efficient a pulse generator performs.

Figure 1:
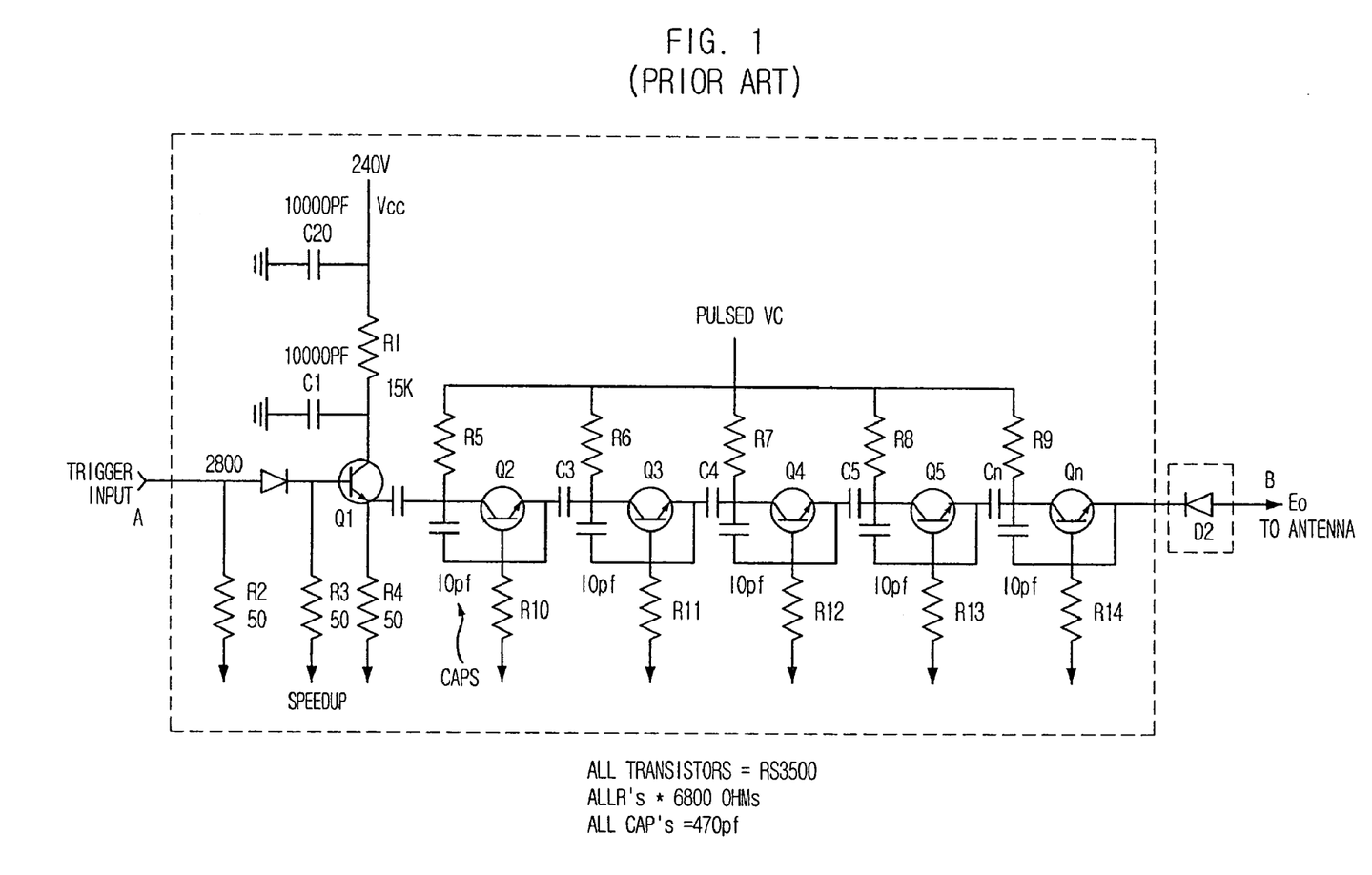
FIG. 1 is a diagram showing a conventional pulse generator.

FIG. 1 is a diagram illustrating a conventional pulse generator. This conventional pulse generator is disclosed in U.S. Pat. No. 5,216,695, entitled 'Short pulse microwave source with a high RPF and low power drain.'

As shown, the conventional pulse generator includes an arbitrary number (N) of Avalanche Transistors in series. The conventional pulse generator generates a high-voltage pulse that is 3 ns in width and has 100 ps of rising and falling time.

In detail, an electric charge builds up in capacitors labeled 'Cx', where x represents numbers from 1 to an arbitrary number n. Upon receiving a trigger signal at the base port of the first Avalanche Transistor labeled 'Q1', the collector and emitter of the first Avalanche Transistor (Q1) are electrically connected, resulting in which the rest of Avalanche Transistors are electrically connected, and, in turn, generating a pulse at the output port labeled 'B'.

One major drawback to the conventional pulse generator is that the repetition period of a pulse cannot exceed 30 KHz, in this case making the pulse generator unsuitable for use in a high speed communication environment.

On the other hand, implementation of data communication in various transmission rates or a multi-user system necessitates the use of multi-frequency band. If multi-frequency band is to be used, it is commonplace to multiply data by a carrier signal so that a center frequency of the data is shifted. However, the frequency of such carrier signal has to be changed rapidly in this case, giving rise to quite a few technical glitches. In addition, there is a limit on shift time that is practically feasible. The limited number of available frequency bands affects the overall system performance.

Figure 2:
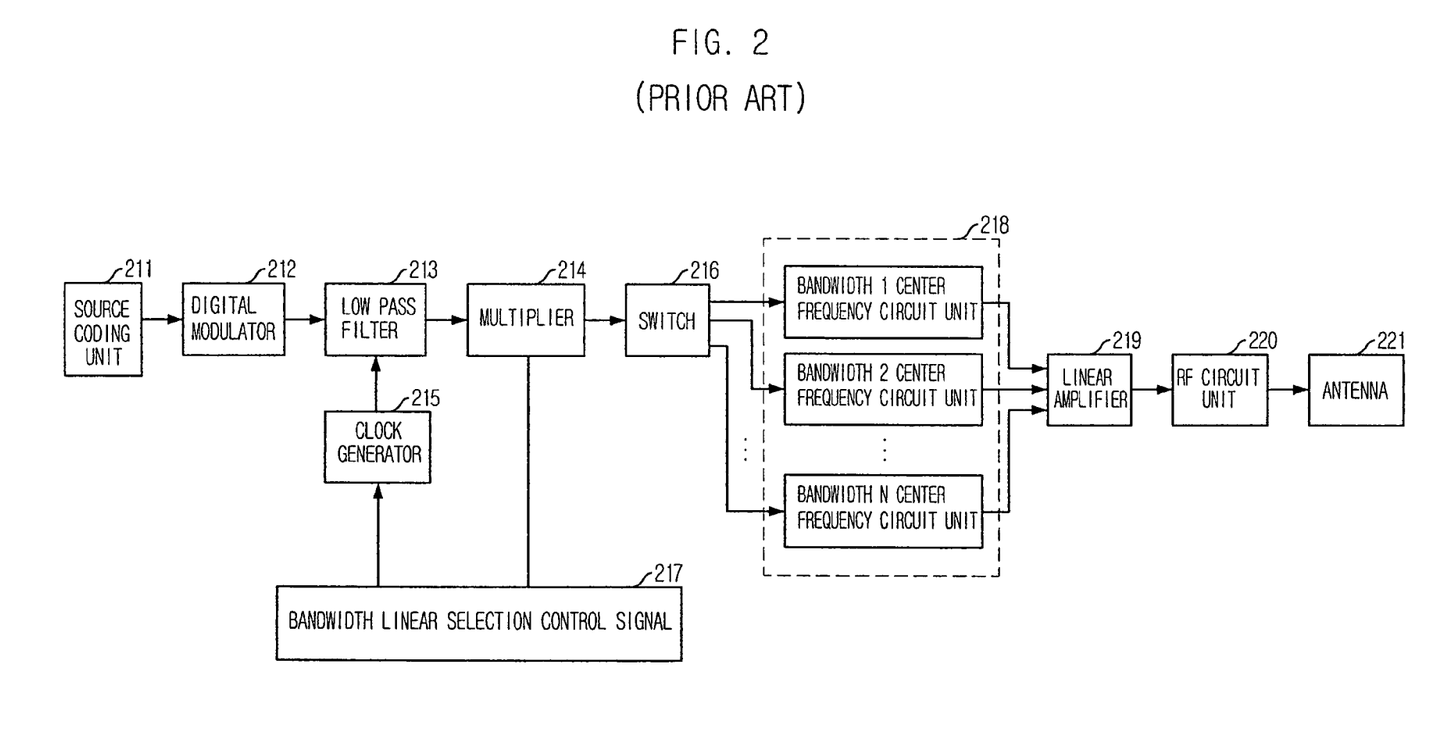
FIG. 2 is a block diagram depicting a conventional digital wireless communication system.

FIG. 2 is a block diagram depicting a conventional digital wireless communication system. The conventional digital wireless communication system is disclosed in Korean Patent No. 10-0295439, entitled 'Transmitting apparatus for use in multi-frequency band wireless communication system.'

As shown, the conventional digital wireless communication system includes a source coding unit 211, a digital modulator 212, a low pass filter 213, a multiplier 214, a switch 215, a clock generator 216, a control signal for a linear selection of bandwidth 217, a center frequency circuit unit 218, a linear amplifier 219, a RF circuit unit 220 and an antenna 221. The center frequency circuit unit 218 includes an arbitrary number (N) of circuit units, each of which has a unique bandwidth.

The shaping of a pulse is effected by passing a signal through the following devices in series: the source coding unit 211, the digital modulator 212 and the low pass filter 213. The clock generator 216 generates a carrier signal. The clock generator 216 has the same frequency as the carrier signal. The multiplier 214 multiplies the signal by the carrier signal, to thereby shift the signal to the frequency band to be used. Then, the signal outputted from the multiplier 214 is passed on to the center frequency circuit unit 218 via the switch 215. The frequency band is processed in the center frequency circuit unit 218. The signal from the center frequency circuit unit 218 passes trough the linear amplifier 219, the RF circuit unit 220 and the antenna 221.

Nonetheless, the following shortcomings exist in the conventional wireless communication system.

First, the clock generator 216 has the same operational speed as the center frequency of the frequency band in use. In which case, the center frequency has to be changed rapidly within a short time, thus requiring an extremely complex circuit. This, in turn, makes a signal vulnerable to the noise and any possible defects in an image frequency signal.

In the event that an irregular occurrence of the frequency shift, the frequency shift takes much longer time than is usually acceptable, limiting the number of users who can access a service at the same time.

In addition, it is necessary one center frequency circuit unit for each frequency band, in this case making the design of the system problematic and limiting the number of available frequency bands.

Since a source signal has to be selectively transferred to a number of the center frequency circuit units 218, the operation of the switch 215 should be precise and exact. In this case, the number of available frequency bands and the transmission speed are limited by the operational speed of the switch 215.

SUMMARY OF THE INVENTION

It is, therefore, an object of the present invention to provide an apparatus and method for generating a pulse based on time delay and wave transform and a transmitter of a multi-frequency band communication system using the same, wherein the width of a pulse is adjusted without using a carrier frequency and multi-frequency bandwidth is applicable to a multi-frequency band and multi-user system.

In accordance with an aspect of the present invention, there is provided an apparatus for generating a pulse based on time delay and wave transform, including: a time delay control unit having a plurality of time delay controller, each for providing time delay information; an amplitude control unit for providing amplitude information; a time delay unit having a plurality of time delayers, each for departing a square wave from a trigger signal, delaying time of the square wave based on the time delay information, and adjusting an amplitude of the square wave based on the amplitude information, to thereby generate a time-delayed signal; a pulse shaping unit for shaping a pulse based on the time-delayed signals; and a wave transforming unit for transforming the pulse to a desired signal.

In accordance with another aspect of the present invention, there is provided a method for generating a pulse based on time delay and wave transform, the method including the steps of: a) separating a square wave from a trigger signal and providing the square wave, time delay information and amplitude information to a time delay unit having a plurality of time delayers; b) at each time delayer, delaying time of the square wave for a predetermined time based on the time delay information, and adjusting an amplitude of the square wave based on the amplitude information, to thereby generate a time-delayed signal; c) at a pulse shaping unit, generating a pulse having a predetermined pulse width based on the time-delayed signals; and d) at a wave transforming unit, transforming a form of the pulse to generate a desired signal.

In accordance with further another aspect of the present invention, there is provided an apparatus for transmitting a signal in a wireless communication system, including: a source encoding unit for encoding a signal to be transmitted, to thereby generate a source encoded signal; a modulating unit for performing digital modulation of the source encoded signal, to thereby generate a modulated signal; a pulse generating unit for generating a pulse signal based on the modulated signal; a pulse bandwidth control unit for adjusting a bandwidth of the pulse signal; a bandwidth selection control unit for providing pulse bandwidth information to the pulse bandwidth control unit; a switching unit for allowing the pulse signal to remove noise capable of being generated; and a transmitting unit for transmitting the pulse signal.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 3:
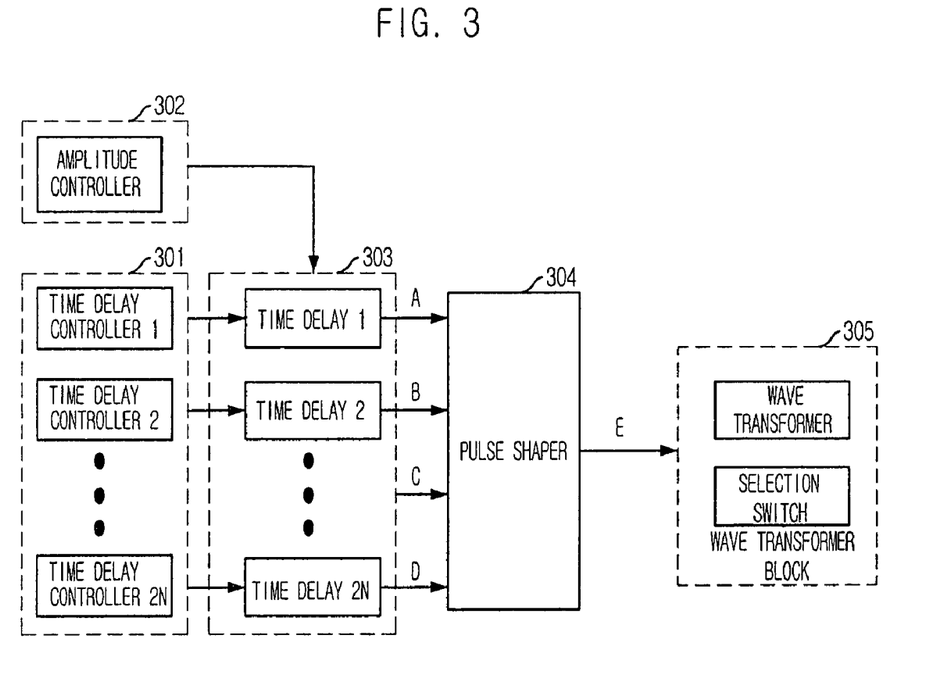
FIG. 3 is a block diagram illustrating a pulse generator in accordance with the present invention.

FIG. 3 is a block diagram illustrating a pulse generator in accordance with the present invention.

As shown, the pulse generator includes a time delay control block 301, an amplitude controller 302, a time delay block (TDB) 303, a pulse shaper 304 and a wave transformer block (WTB) 305.

The time delay control block 301 includes 2N time delay controller (N is an integer equal to or larger than 1) and adjusts the degree to which time. The time delay control block 301 provides the time delay information to the TDB 303 and controls the TDB 303 to delay time finely.

The amplitude controller 302 controls amplitude of a pulse to be generated and provides amplitude information to the pulse shaper 304.

The TDB 303 includes 2N time delay controller (N is an integer equal to or larger than 1). Each time delay controller separates a square wave from an input trigger signal and delays time of the square wave to generate a time-delayed signal based on the time delay information obtained from the time delay controller in the time delay control block 301. The output signals from the time delayers in the TDB 303 are fed into the pulse shaper 304.

The pulse shaper 304 generates a pulse based on the information from the amplitude controller 302 and the TDB 303. A pulse width of a pulse generated in the pulse shaper 304 is expressed as:

(The width of a pulse that comes out of the pulse shpaer)=(the time delay in the TDB 1)+(the time delay in the TDB 2)+. . . +(the time delay in the TDB 2N)     Eq. (1)

The pulse shaper 304 combines signals from the time delayers in the TDB 303. The output signals from the time delayers have time delay to each other. Accordingly, combination of the output signals from the TDB 303 is to form a signal depending on which section of the input signal is fed into the TDB 303.

The WTB 305 incorporates a wave transformer and a selection switch. The wave transformer in the WTB 305 transforms the output signal from the pulse shaper 304 into a desired signal. The selection switch chooses one of positive and negative signals. The WTB 305 sends out a signal chosen by the selection switch therein in a predetermined time.

The pulse generator in accordance with the present invention can adjust the pulse width based on the time delay performed in the TDB 303 which is controlled by the time delay control block 301. In addition, a center frequency is shifted so that an unwanted frequency band can be avoided. Switching from the channel in use to a different channel is possible in the multi channel system. The WTB 305 can transform the final output signal to suit an individual needs.

Hereinafter, the pulse generating method will be described in detail with reference to FIGS. 4 and 5.

Figure 4:
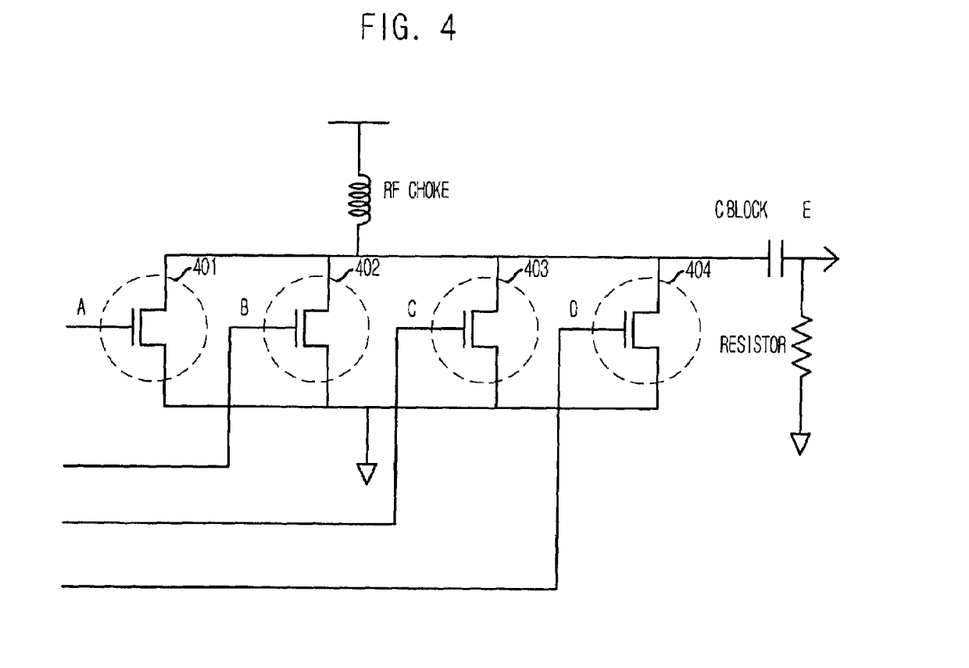
FIG. 4 is a detailed diagram showing a pulse shaper of FIG. 3 in case N=2.
Figure 5:
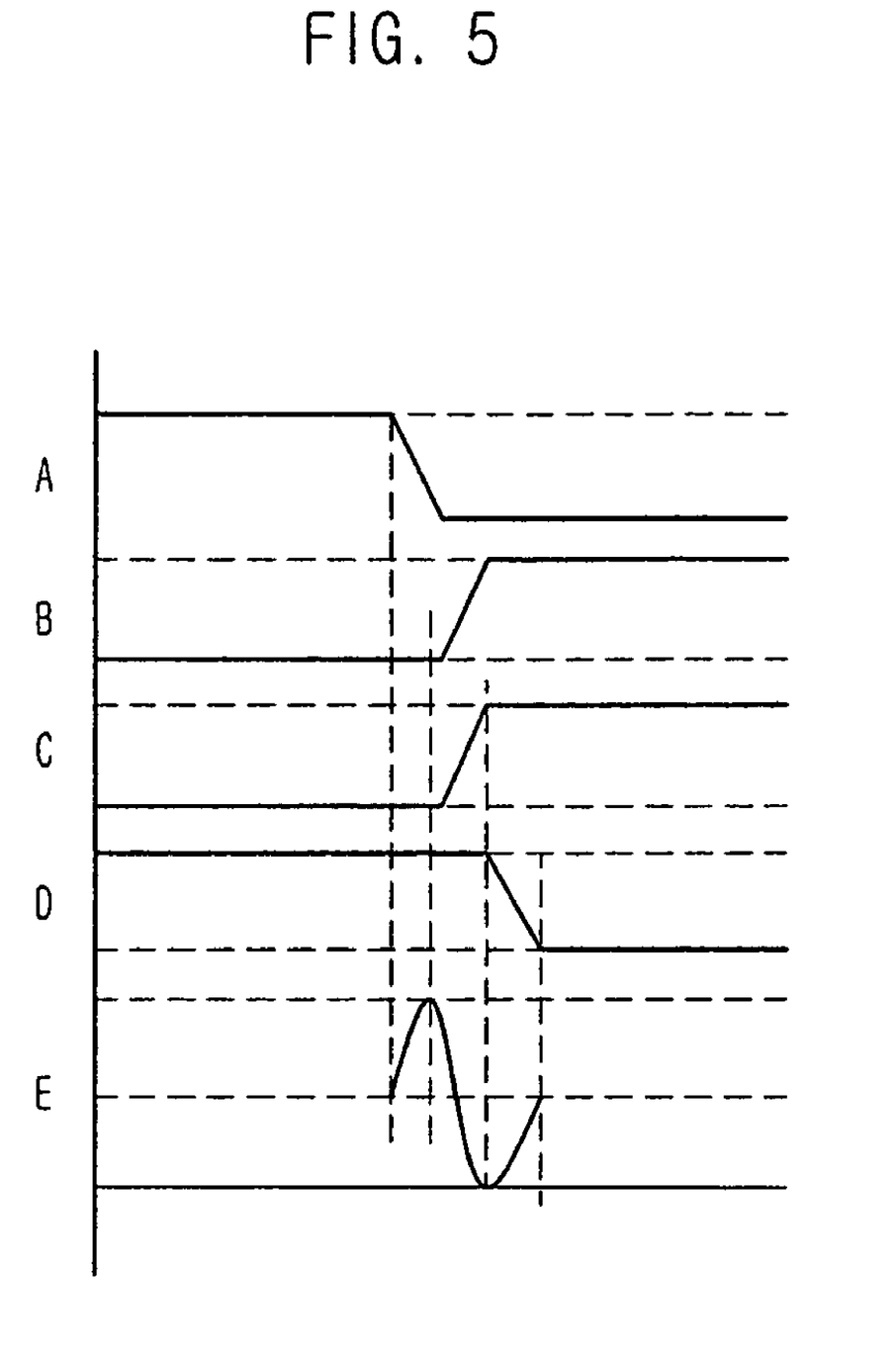
FIG. 5 is a timing diagram illustrating timing of the pulse generator in accordance with the present invention.

FIG. 4 is a detailed diagram showing a pulse shaper of FIG. 3 in case of N=2; and FIG. 5 is a diagram showing timing of the pulse generator in accordance with the present invention.

As shown, waves labeled 'A', 'B', 'C' and 'D' (which are referred to as 'A', 'B', 'C' and 'D' waveforms) show the waveforms of the output signal from the time delayers 1 to 4. Each of the waveforms can be controlled by the time delay.

If the 'A' waveform is high, 'B' and 'C' waveforms are low, and 'D' waveform is high, the circuit is stable and a voltage of a resistor is 0. If 'A' waveform is low, the current on the transistor 401 is shorted, and a positive voltage is applied to the resistor instantaneously. If 'B' and 'C' waveforms become high simultaneously, the current on the transistors 402 and 403 are to be flowed, and a negative voltage is applied to the resistor. If the 'D' waveform becomes from high to low, a positive voltage is applied to the resistor. A pulse 'E' is generated according to the operations mentioned above. A pulse width of the pulse 'E' is decided by the time delays of 'A', 'B', 'C' and 'D' waveforms, and an amplitude of the pulse 'E' is a swing width of the 'A', 'B', 'C' and 'D' waveforms.

FIGS. 6A to 6D are detailed diagrams illustrating a pulse generator in accordance with an embodiment of the present invention.

Figure 6A:
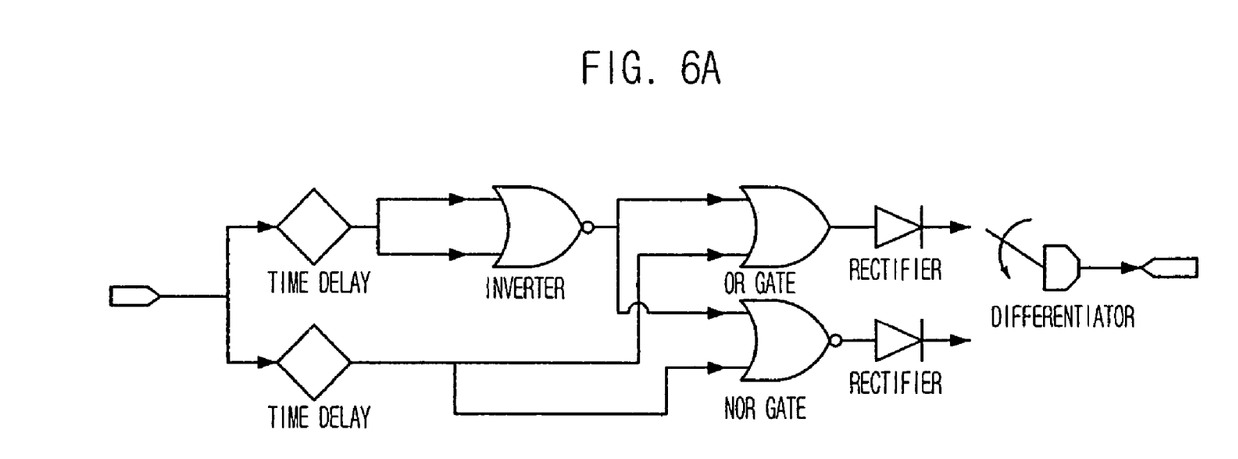
FIGS. 6A to 6D are diagrams depicting pulse generators in accordance with the present invention.

Referring to FIG. 6A, a time delayer and an inverter are in use to generate an inverted signal and a non-inverted signal. If the delay time of the non-inverted signal is larger than that of the inverted signal, the value of the signal is '1' for the duration of time equivalent to the difference between the time delay of the non-inverted signal and the time delay of the inverted signal and '0' for the other times. An OR gate outputs '1' only if all input signals fed into the OR gate are the same status '1'. The OR gate generates a pulse whose a width is equivalent to the difference between the time delay of a non-inverted signal and the time delay of an inverted signal. In which case, the status of the pulse changes from HIGH to LOW for the time difference. A NOR gate outputs '1' only if all input signals fed into the NOR gate are the same status '0'. The NOR gate generates a pulse whose width is equivalent to the difference between the time delay of the non-inverted signal and the time delay of the inverted signal. In which case, the pulse changes from LOW to HIGH for the time difference. Each output signal passes through its own rectifier and is then fed into a differentiator through a switch. The differentiator turns out a mono-cycle signal.

Figure 6B:
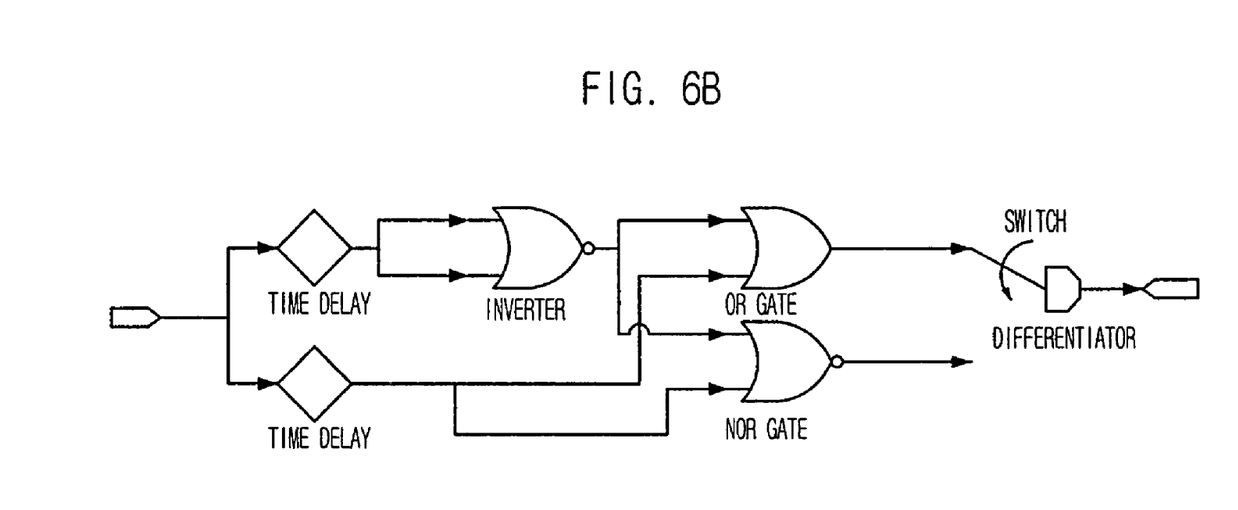

Referring to FIG. 6B, a time delayer and an inverter are in use to generate an inverted signal and a non-inverted signal. If the delay time of the non-inverted signal is larger than that of the inverted signal, the value of the signal is '1' for the duration of time equivalent to the difference between the time delay of the non-inverted signal and the time delay of the inverted signal and '0' for the other times. An OR gate outputs '1' only if all input signals fed into the OR gate are the same status '1'. The OR gate generates a pulse whose a width is equivalent to the difference between the time delay of a non-inverted signal and the time delay of an inverted signal. In which case, the status of the pulse changes from HIGH to LOW for the time difference. A NOR gate outputs '1' only if all input signals fed into the NOR gate are the same status '0'. The NOR gate generates a pulse whose width is equivalent to the difference between the time delay of the non-inverted signal and the time delay of the inverted signal. In which case, the pulse changes from LOW to HIGH for the time difference. In this case, no rectifier is in use. The differentiator turns out a mono-cycle signal.

Figure 6C:
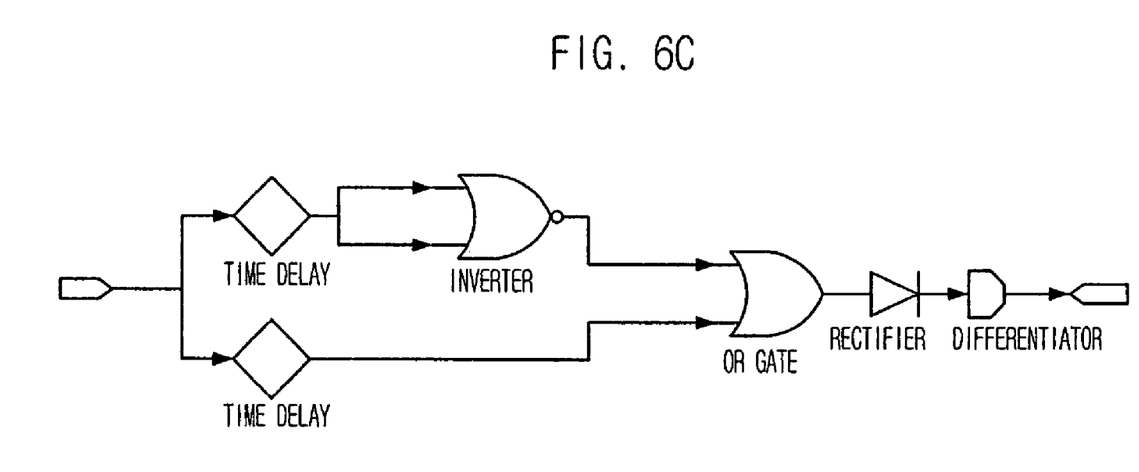

Referring to FIG. 6C, a time delayer and an inverter are in use to generate an inverted signal and a non-inverted signal. If the delay time of the non-inverted signal is larger than that of the inverted signal, the value of the signal is '1' for the duration of time equivalent to the difference between the time delay of the non-inverted signal and the time delay of the inverted signal and '0' for the other times. An OR gate outputs '1' only if all input signals fed into the OR gate are the same status '1'. The OR gate generates a pulse whose a width is equivalent to the difference between the time delay of a non-inverted signal and the time delay of an inverted signal. In which case, the status of the pulse changes from HIGH to LOW for the time difference. The output signal from the OR gate passes through a rectifier and is fed into a differentiator. In this case, no switch is in use. The differentiator turns out a mono-cycle signal.

Figure 6D:
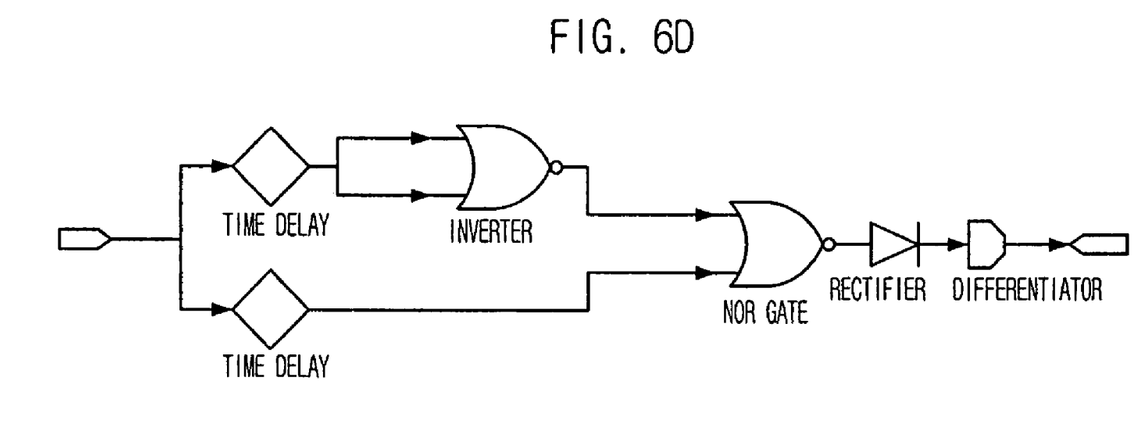

Referring to FIG. 6D, a time delay device and an inverter are in use to generate an inverted signal and a non-inverted signal. If the delay time of the non-inverted signal is larger than that of the inverted signal, the value of the signal is '1' for the duration of time equivalent to the difference between the time delay of the non-inverted signal and the time delay of the inverted signal and '0' for the other times. A NOR gate outputs '1' only if all input signals fed into the NOR gate are the same status '0'. The NOR gate generates a pulse whose width is equivalent to the difference between the time delay of the non-inverted signal and the time delay of the inverted signal. In which case, the pulse changes from LOW to HIGH for the time difference. The output signal from the NOR gate passes through a rectifier and is fed into a differentiator. The differentiator turns out a mono-cycle signal.

Figure 7:
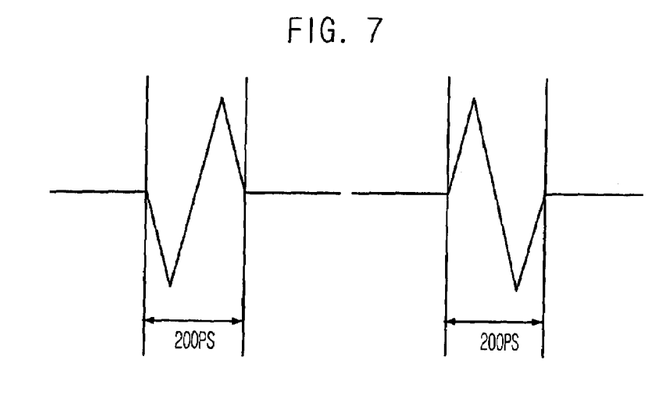
FIG. 7 is a diagram depicting an output pulse of the pulse generator in accordance with the present invention.

FIG. 7 is a diagram depicting a final output pulse of the pulse generator in accordance with the present invention.

As shown, the waveform of the final output signal contains both a positive pulse and a negative pulse. The pulse width of the final output signal is equivalent to sum of the time delays in TDB 1 to TDB 2N. The amplitude of the final output signal is decided based on the amplitudes of the waveforms 'A', 'B', 'C' and 'D'.

Figure 8:
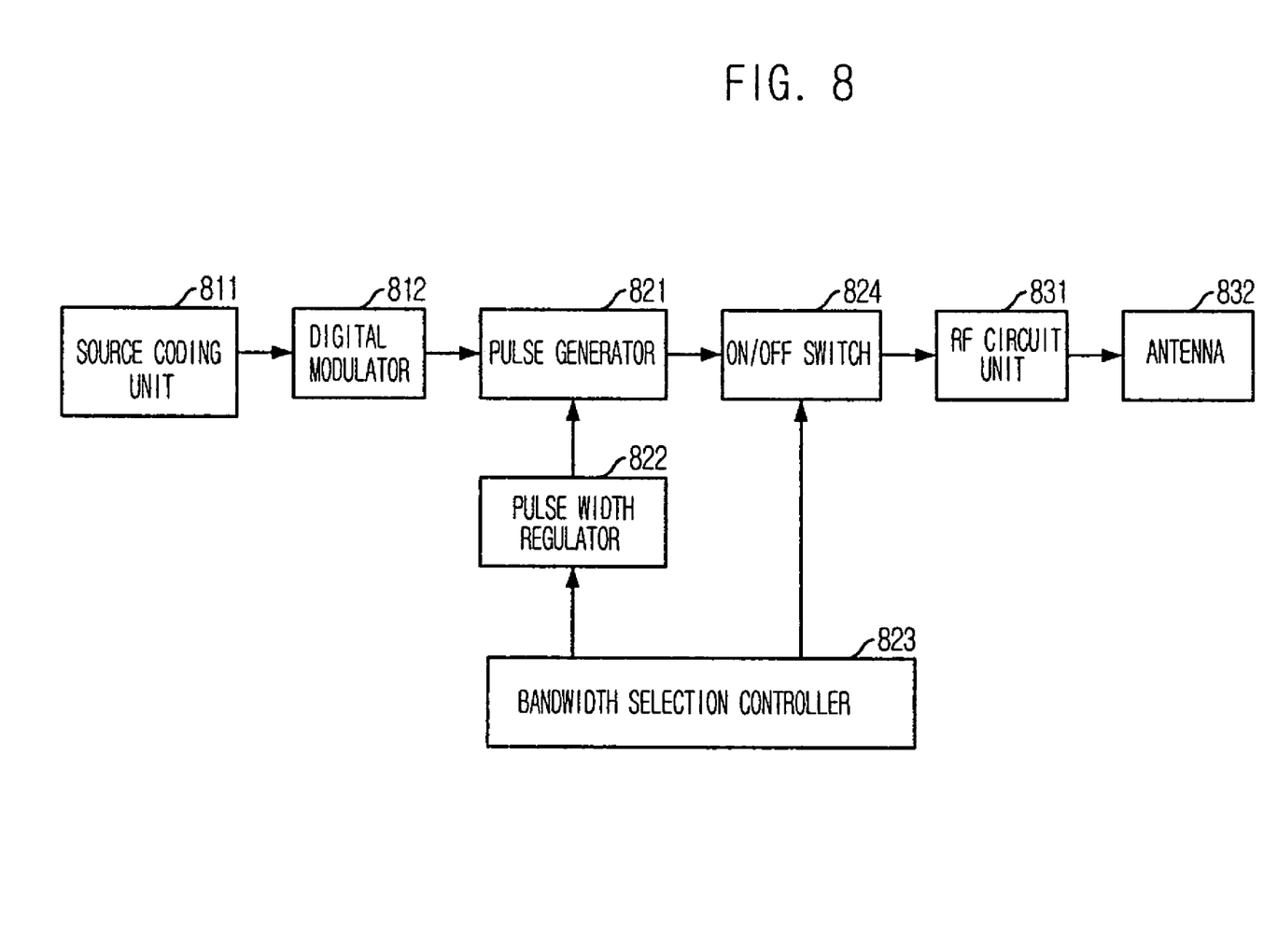
FIG. 8 is a diagram showing a multi-frequency band communication system.

FIG. 8 is a diagram showing a transmitter of a multi-frequency band communication system in accordance with the present invention.

As shown, the transmitter of the wireless communication system includes a source coding unit 811, a digital modulator 812, a pulse generator 821, a pulse width regulator 822, a bandwidth selection controller 823, an ON/OFF switch 824, a RF circuit unit 731 and an antenna 832. The source coding unit 811 performs a source coding of data to be transmitted to generate a source coded signal. The digital modulator 812 performs a digital modulation of the source coded signal to generate a modulated signal. The modulated signal has a value "0" or "1."

The pulse generator 821 generates a pulse based on the modulated signal. The pulse width regulator 822 adjusts the pulse width of the pulse generator. The bandwidth selection controller 823 provides the pulse width information of the center frequency to the pulse width regulator 822. The pulse has a pulse width "1/center frequency."

The ON/OFF switch 824 removes ripples of the pulse wherein the ripple is generated during the generation of the pulse. The RF circuit unit 831 processes the pulse outputted from the ON/OFF switch 824 in order to generate a radio frequency (RF) signal, e.g., up-conversion. The antenna 832 radiates the RF signal to be transmitted.

As mentioned above, the pulse generator having a simple structure can adjust the pulse width of the pulse, and a transmitter of the multi frequency band communication system shifts the center frequency of the pulse using the same. In other words, the transmitter divides the time based on the number of users or a transmission rate, for one divided time, adjusts the pulse width of the pulse and shifts the center frequency of the pulse, and transmits the pulse by using the switch only when the pulse is transmitted. The time division multi band transmission is performed by changing the pulse width of the pulse in another divided time and turning on the ON/OFF switch.

The pulse generator shifts the center frequency of the pulse and the frequency in use by adjusting the pulse width, and shifts the frequency in use irregularly by changing the pulse width randomly. On the other hands, the transmitter connects the switch during only transmission of the pulse.

The transmitter allocates a frequency band for a divided time to a user. The transmitter allocates a different frequency band for each of the divided times, to thereby perform a high speed data transmission.

The pulse generator adjusts the frequency band in use based on the pulse width, and therefore, can divide the frequency bands as many as the number of system's necessary by adjusting the center frequency finely.

The wireless communication system using the pulse generator in accordance with the present invention can remove limitation the number of the users and the transmission rate, because the frequency band is shifted within a short time.

Since the transmitter opens the switch when the pulse is not transmitted, the transmitter can save the power consumption and remove affect on noise or ripple of the pulse. Also, the transmitter performs change of the frequency band at a high speed.

While the present invention has been described with respect to certain preferred embodiments, it will be apparent to those skilled in the art that various changes and modifications may be made without departing from the scope of the invention as defined in the following claims.

What is claimed is:

1. An apparatus for generating a pulse based on time delay and wave transform, comprising:
    a time delay control means having a plurality of time delay controllers, each for providing time delay information;
    an amplitude control means for providing amplitude information;
    a time delay means having a plurality of time delayers, each for delaying a square wave from a trigger signal, delaying time of the square wave based on the time delay information, and adjusting an amplitude of the square wave based on the amplitude information, to thereby generate a time-delayed signal;
    a pulse shaping means for shaping a pulse based on the time-delayed signals; and
    a wave transforming means for transforming the pulse to a desired signal.

2. The apparatus as recited in claim 1, wherein the pulse width of the pulse signal is equal to sum of the time delays in the time delayers.

3. The apparatus as recited in claim 1, wherein the wave transforming means transforms the pulse signal into a desired signal and selects one of a positive signal, and a negative signal of the desired signal.

4. A method for generating a pulse based on time delay and wave transform, the method comprising the steps of:
    a) separating a square wave from a trigger signal and providing the square wave, time delay information and amplitude information to a time delay means having a plurality of time delayers;
    b) at each time delayer, delaying time of the square wave for a predetermined time based on the time delay information, and adjusting an amplitude of the square wave based on the amplitude information, to thereby generate a time-delayed signal;
    c) at a pulse shaping means, generating a pulse having a predetermined pulse width based on the time-delayed signals; and
    d) at a wave transforming means, transforming a form of the pulse to generate a desired signal.

5. The method as recited in claim 4, wherein the predetermined pulse width is equal to sum of the time delays in the time delayers.

6. An apparatus for transmitting a signal in a wireless communication system, comprising:
    a source encoding means for encoding a signal to be transmitted, to thereby generate a source encoded signal;
    a modulating means for performing digital modulation of the source encoded signal, to thereby generate a modulated signal;
    a pulse generating means for generating a pulse signal based on the modulated signal;
    a pulse bandwidth control means for adjusting a bandwidth of the pulse signal;
    a bandwidth selection control means for providing pulse bandwidth information to the pulse bandwidth control means;
    a switching means for allowing noise to be removed from the pulse signal ; and
    a transmitting means for transmitting the pulse signal.

7. The apparatus as recited in claim 6, wherein the time is divided based on the number of users or a transmission rate, the center frequency of the pulse is shifted by adjusting the pulse width of the pulse for one divided time, the pulse is transmitted only when the pulse is transmitted, and the time division multi band transmission is performed by changing the pulse width of the pulse in another divided time.

8. The apparatus as recited in claim 6, wherein the center frequency of the pulse and the frequency band in use are shifted by adjusting the pulse width.

9. The apparatus as recited in claim 8, wherein the pulse width is randomly changed to shift the frequency band in use randomly.

10. The apparatus as recited in claim 8, wherein a frequency band is allocated for a divided time based on a time division.

11. The apparatus as recited in claim 8, wherein a user is allocated for a divided time based on a time division.

12. The apparatus as recited in claim 8, wherein a different frequency band is allocated for each divided time, to thereby increase a transmission rate.

13. The apparatus as recited in claim 8, wherein the switching means is controlled to be connected only when the pulse signal is transmitted.

* * * * *